(12) United States Patent
Phi

(10) Patent No.: US 6,718,449 B2
(45) Date of Patent: Apr. 6, 2004

(54) SYSTEM FOR DATA TRANSFER BETWEEN DIFFERENT CLOCK DOMAINS, AND FOR OBTAINING STATUS OF MEMORY DEVICE DURING TRANSFER

(75) Inventor: Hung Phi, San Jose, CA (US)

(73) Assignees: Sony Corporation, Tokyo (JP); Sony Electronics Inc., Woodcliff Lake, NJ (US)

( * ) Notice: Subject to any disclaimer, the term of this patent is extended or adjusted under 35 U.S.C. 154(b) by 243 days.

(21) Appl. No.: 09/901,738

(22) Filed: Jul. 9, 2001

(65) Prior Publication Data

US 2003/0007394 A1 Jan. 9, 2003

(Under 37 CFR 1.47)

(51) Int. Cl.[7] .............................................. G06F 12/00
(52) U.S. Cl. ...................... 711/167; 711/147; 711/149; 710/29; 709/400
(58) Field of Search .................................. 711/147, 149, 711/167; 709/400; 710/29

(56) References Cited

U.S. PATENT DOCUMENTS

| | | | | |
|---|---|---|---|---|
| 5,852,608 A | * | 12/1998 | Csoppenszky et al. | 370/465 |
| 5,898,889 A | * | 4/1999 | Davis et al. | 710/29 |
| 6,033,441 A | * | 3/2000 | Herbert | 709/400 |
| 6,327,207 B1 | * | 12/2001 | Sluiter et al. | 365/221 |
| 6,366,530 B1 | * | 4/2002 | Sluiter et al. | 365/240 |
| 6,594,329 B1 | * | 7/2003 | Susnow | 375/372 |

* cited by examiner

Primary Examiner—T Nguyen
(74) Attorney, Agent, or Firm—Charles J. Kulas; Carpenter & Kulas, LLP

(57) ABSTRACT

A system for data transfer between different clock domains, and for efficiently obtaining the status of a memory device utilized during the process of data transfer. The different clock domains include a first clock domain controlled by a first frequency and a second clock domain controlled by a second frequency different from the first frequency. The system features a first counter circuitry operating at the first clock frequency which increments in response to a write control signal. The system further features first and second sync circuitries for translating write and read signals, and a second counter circuitry operating at the second clock frequency, which decrements in response to the read control signal. In addition, the first circuitry decrements in response to the read signal while the second circuitry increments in response to a write signal. In this manner, the first and second counter circuitries reflect the status of the memory device used for buffering data during the data transfer.

9 Claims, 3 Drawing Sheets

SYSTEM FOR DATA TRANSFER BETWEEN DIFFERENT CLOCK DOMAINS, AND FOR OBTAINING STATUS OF MEMORY DEVICE DURING TRANSFER

BACKGROUND OF THE INVENTION

The present invention is directed to the field of computer and information processing, and specifically to memory devices for storing and transferring data.

Conventional memory devices for storing and transferring data within an electronic circuit are well known. One example of a memory device is a FIFO (first in first out) memory device for temporarily holding (buffering) digital data to be transferred from one location to another. As implied by its name, a FIFO memory device establishes a first in first out order which permits data to be read in the order it was written. FIFO memory devices are particularly important when data is transferred from a first clock domain controlled by a first clock frequency to a second domain controlled by a second clock frequency. For example, in PCs (personal computers), it is typically the case that a number of data buses operating at different clock speeds may be found. A first data bus may be a PCI (peripheral component interconnect) bus operating at 33 megahertz while a second data bus such as an EISA (extended industry standard architecture) bus may operate at 8 megahertz within the computer system. In order to transfer information between the PCI and EISA buses, one side of a FIFO operates at the first clock domain speed while the other side operates at the second clock speed.

A further application of FIFO memory devices is the so-called display FIFOs used in graphics display systems to buffer the data for screen refreshes. The screen is typically refreshed by draining the display FIFO at a certain read rate. However, the read rate and the write rate to fill the FIFO are different. The read rate is based on the video clock rate (VCLK) (e.g., 100 Mb/s) at which the display screen requires refreshed data while the write rate (e.g. 800 Mb/s) to fill the display FIFO is based on the memory clock (XCLK) since the memory clock is used to retrieve data from memory. FIG. 1A, below, is provided to facilitate understanding of a conventional FIFO circuitry.

FIG. 1A is a block diagram of a conventional memory circuit 100 for transferring data between a first clock domain A and a second clock domain B. In FIG. 1A, circuit 100 comprises sync circuits 102, 106 for reducing noise jitters and for providing bit synchronization during the data transfer process. Inputs to sync circuit 102 are a WRITE_DATA signal for indicating the data units to be written to memory 104, a WRITE_ADDRESS for indicating the appropriate write address, a WRITE_CONTROL signal, and a clock signal A_CLK operating at the first clock frequency. Inputs to sync circuit 106 are a READ_DATA signal for indicating the data to be read from memory 104, a READ_ADDRESS signal for providing the appropriate address, a READ_CONTROL signal and a clock signal B_CLK operating at the second clock frequency.

It should be noted that sync circuits 102, 106, respectively, are within clock domain A (the write side circuitry) which is controlled by a first clock frequency, and clock domain B (the read side circuitry) operating at a second clock frequency different from the first frequency. Other components of circuit 100 include a memory data unit 104 for storing data to be transferred between clock domains A and B; comparators 108, 114 for evaluating write and read address pointers to determine the status of memory 104, that is, whether memory 104 is full or empty; and pointer sync circuits 110, 112 for translating address pointers from one clock domain to the other.

In operation, to accurately transfer data between the clock domains, the status of memory 104 is constantly being tracked to determine when the memory device is full or empty. The status from clock domain A, for example, is obtained by employing pointer sync circuit 110 to translate the WRITE ADDRESS pointer from clock domain A to clock domain B. There, the translated WRITE ADDRESS pointer is fed into comparator 114 which compares the translated write address pointer to the READ ADDRESS pointer received from clock domain B. This comparison yields an indication as to whether memory 104 is full or empty.

A similar process occurs to determine the memory status from clock domain B. The status from clock domain B is obtained from pointer synch circuitry 112 to translate the READ ADDRESS from clock domain B to A Herein lies the disadvantage of such conventional memory circuitry. The time taken to obtain a memory status from either clock domain is relatively long, typically about 8 to 9 clocks. It takes a longer time because the write or read pointers have to be translated from one clock domain to the other. As shown, FIG. 1A illustrates a timing diagram showing the time it takes to acquire a memory status (i.e., Aempty) from clock domain A using conventional memory circuit 100. In FIG. 1A, it takes about 9 clocks to determine that memory 104 is empty. Given the foregoing disadvantages, there is a need to resolve the problems relating to conventional approaches for transferring data between different clock domains, and for efficiently obtaining the status of a memory device during the data transfer process.

BRIEF SUMMARY OF THE INVENTION

A first embodiment of the present invention discloses a system for transferring data between different clock domains, and for efficiently obtaining the status of a memory device during the data transfer process. The different clock domains may be a first and a second clock domain, for example. The first clock domain is controlled by one frequency while a second clock domain is controlled by a different frequency. In other words, the embodiment is capable of functioning irrespective of the clock speeds of the first and second clock domains. In order to accomplish this data transfer functionality, the system employs, among other circuitry, a FIFO memory device for buffering the data during the data transfer process. Further, the first embodiment is capable of efficiently obtaining the status of the FIFO memory device as to whether the FIFO is full or empty, during the data transfer process. Therefore, at the very least, the first embodiment teaches a system for transferring data from a first frequency domain to a second, and vice-versa, and for tracking the status of the memory device.

In an alternate embodiment, the present invention discloses a system for determining the status of a memory device during the transfer of data from a first clock domain controlled by a first frequency to a second domain controlled by a second frequency, the second frequency being different from the first frequency. The system further includes a write control signal operating at the first clock frequency for writing the data into the memory device and a first counter circuitry operating at the first clock frequency. The first counter circuitry receives the write control signal and in response thereof increments the first counter circuitry. A second counter circuitry operating at the second clock frequency and a first sync circuitry, which similarly receives the write control signal that is received by the first counter circuitry, translates the write control signal from the first clock frequency to the second clock frequency.

Thereafter, the translated write control signal increments the second counter circuitry. Other components include a read control signal operating at the second clock frequency for initiating a read operation from the memory device and a second counter circuitry operating at the second clock frequency and receiving the read control signal. In response, the write control signal decrements the second counter circuitry. A second sync circuitry that receives the read control signal, which is similarly received by the second counter circuitry, translates the read control signal from the second clock domain to the first clock domain in order to decrement the first counter circuitry. The first counter circuitry has an output for determining, within the first clock domain, whether the memory device is full or empty.

In a further embodiment, the present invention teaches a system for tracking control signal operations occurring within a memory device when data is being transferred between a first clock domain and a second clock domain. The system includes a write control signal that implements a write control operation for transferring data into the memory device, and a first up/down counter which receives the write control signal for the purpose of incrementing the first up/down counter by a first count. Other components of the system include a second up/down counter circuitry, and a first sync circuitry, which similarly receives the write control signal received by the first counter circuitry, and translates the write control signal from the first clock domain to the second clock domain. Next, the translated write control signal increments the second counter circuitry by a first count, the first and second counters indicating the number of write operations occurring within the memory device.

The present invention, in a further aspect, is a method of using write and read control signals in an electronic circuit, for determining the status of a memory device during the transfer of data between different clock domains. The method includes a number of steps, namely, receiving the write control signal operating at the first frequency, and incrementing a first up/down counter circuitry within the first clock domain. Other steps include incrementing a second up/down counter circuitry within the second clock domain in response to receiving the write control signal, receiving the read control signal operating at the second clock frequency, decrementing the second up/down counter circuitry within the second clock domain in response to receiving the read control signal, and decrementing the first up/down counter circuitry within the first clock domain in response to receiving the write control signal. It should be observed that the status of the memory device is determinable based on the number of read and write operations occurring within each up/down counter circuitry.

BRIEF DESCRIPTION OF THE OF THE DRAWINGS

DETAILED DESCRIPTION OF THE INVENTION

A first embodiment of the present invention relates to a system for transferring data between a first clock domain controlled by a first frequency and a second clock domain controlled by a second frequency. The embodiment is capable of functioning irrespective of the clock speeds of the first and second clock domains. A FIFO memory device for buffering the data during the data transfer process is employed for the purpose of accomplishing the data transfer functionality. Further, the first embodiment is capable of efficiently obtaining the status of the FIFO memory device as to whether the FIFO is full or empty, during the data transfer process. Therefore, at the very least, the first embodiment teaches a system for transferring data from a first frequency domain to a second, and vice-versa, and for tracking the status of the memory device. The present invention will be further understood with reference to the diagrams and descriptions which follow. Although not shown, one of ordinary skill in the art will realize that other alternate embodiments and modifications for accomplishing the functionalities of the present invention are possible.

Figure 2A:
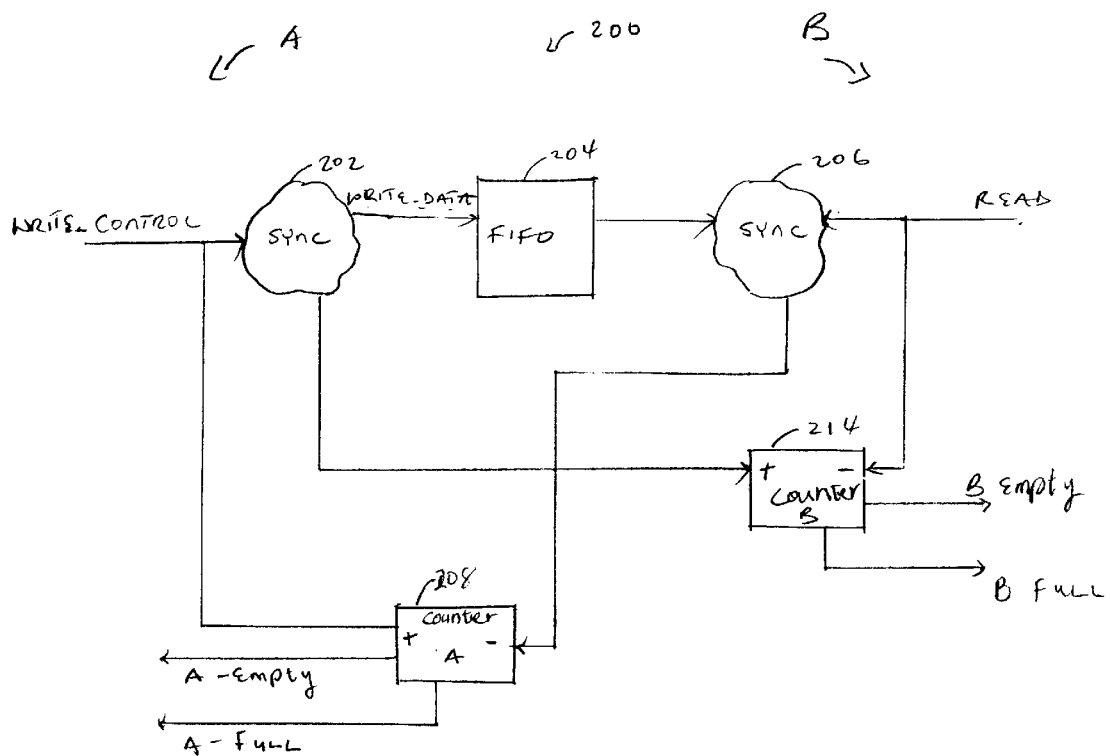
FIG. 2A is a block diagram of a memory circuit for transferring data between multiple clock domains in accordance with the present invention.

FIG. 2A is a block diagram of a memory circuit 200 for transferring data between multiple clock domains in accordance with the present invention.

In FIG. 2A, circuit 200 comprises a first side referred to as clock domain A which is controlled by an exemplary clock frequency of 33 MHz, and a second side or clock domain B, operating at an exemplary frequency of 8 MHz. As used herein, a clock domain is a portion of an electronic circuit that is exclusively controlled by a single clock signal operating at a designated speed. Among other components, clock domain A contains a sync circuit 202 for reducing noise jitters and for providing bit synchronization during the data transfer process as is well known in the art; a memory data unit 204 for storing data to be transferred between clock domain A and B; as well as a counter circuitry 208 for providing an indication of the status of memory 204 for clock domain A.

Similarly, clock domain B contains components analogous to those in clock domain A, namely, sync circuit 206 for reducing noise jitters and for providing bit synchronization during the data transfer process as is well known in the art; a memory data unit 204 for storing data to be transferred between clock domain A and B; as well as a counter circuitry 214 for providing an indication of the status of memory 204 for clock domain B. Although not shown, one of ordinary skill in the art will realize that the functionality of each block may be performed in conjunction with other blocks or by separating the functionality of each of the blocks shown in FIG. 2.

Figure 1A:
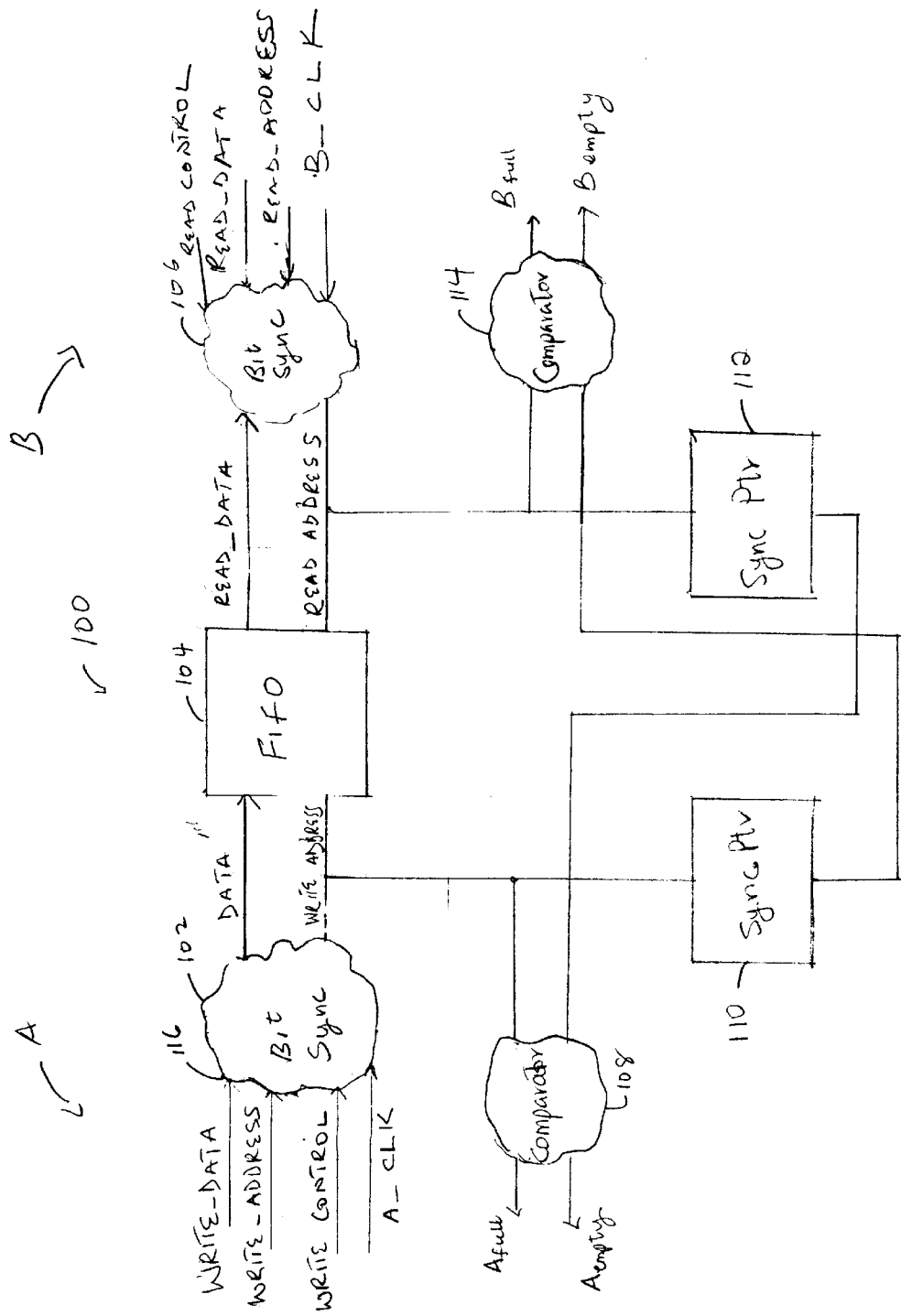
FIG. 1A is a block diagram of a conventional memory circuit for transferring data between a first clock domain and a second clock domain.
Figure 1B:
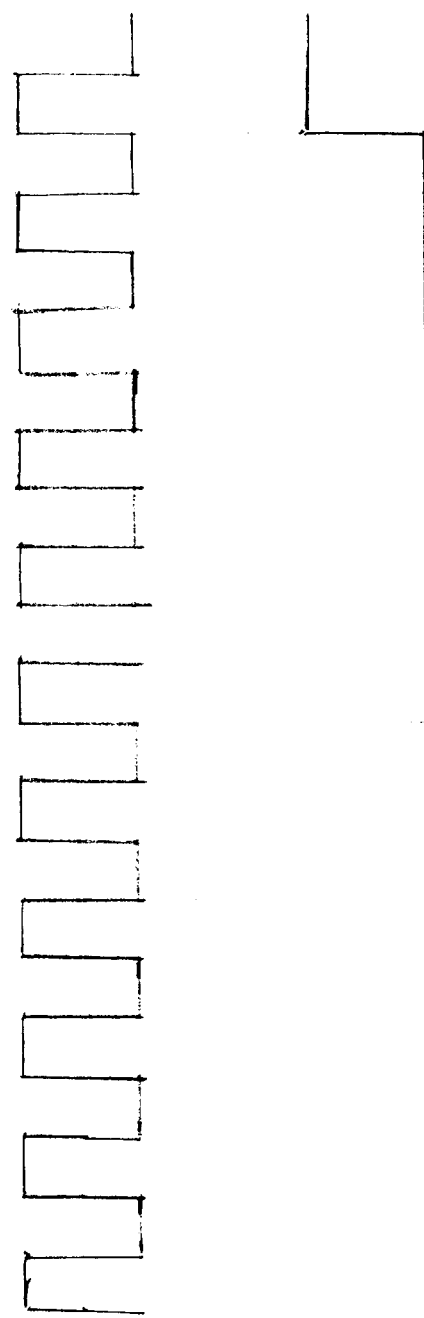
FIG. 1B is timing chart showing the clock periods expended to obtain a status of a memory device using the circuit of FIG. 1.

Sync circuit 202 has a WRITE_CONTROL signal for initiating a data write operation into memory 204 as well as other inputs (not shown) that operate in the same way and manner as the inputs of sync circuit 102 (FIG. 1). A further functionality of sync circuit 202 is to translate the WRITE_CONTROL signal from clock domain A to clock domain B. In a similar fashion, sync circuit 206 functions to translate a READ_CONTROL signal from clock domain B to clock domain A. Sync circuits for performing translation of signals between different clock domains are well known and need not be discussed in detail. In an alternate embodiment, sync circuit 202, 206 may function to prevent a condition commonly referred to as metastability. Metastability results when the "in" state at the input of a memory device occurs within less than a specified set up time (specified by the manufacturer), or there is a change in state at the input occurring within less than a specified hold time (also specified by the manufacturer).

Memory 204, in the present embodiment, is a dual ported FIFO and is bidirectional such that each port is capable of performing read or write operations. Each port is also frequency independent, wherein each port may be clocked at a first frequency independent of the other port which may be clocked at a second frequency. Specifically, as mentioned, the port on the write side (clock domain A) is clocked at 33 MHz while the port within the read side (clock domain B) is clocked at 8 MHz. Hence, data may be written in at 33 MHz and read out on the other side at 8 MHz, for example. However, it is well understood that frequencies other than those employed in the present invention may be utilized. Moreover, as noted, each frequency is independent from each other so that no frequency relationship need exist. That is, one frequency need not be a multiple of the other. Referring now to counter circuitry 208, it is a conventional up/down counter. As implied by its name, up/down counter 208 counts either up or down to provide an indication of the status of memory 204 for the clock domain A side of circuit 200. Similarly, counter circuitry 214 is a conventional up/down counter which counts either up or down except that it provides an indication of the status of memory 204 from clock domain B.

In a typical operation, to transfer data from clock domain A to clock domain B, the WRITE_CONTROL signal is initiated to WRITE_DATA into memory 204 as known in the art. Herein lies a first advantage of the present invention. When the WRITE_CONTROL signal occurs, sync circuit 202 translates WRITE_CONTROL signal from clock domain A to clock domain B and increments up/down counter circuitry 214 for the purpose of keeping track of the number of data writes occurring into memory 204. In addition to incrementing up/down counter 214 in clock domain B, up/down counter 208 in clock domain A is incremented as well. Therefore, with each occurrence of the WRITE_CONTROL signal, both up/down counters 214, 208 are incremented.

Figure 2B:
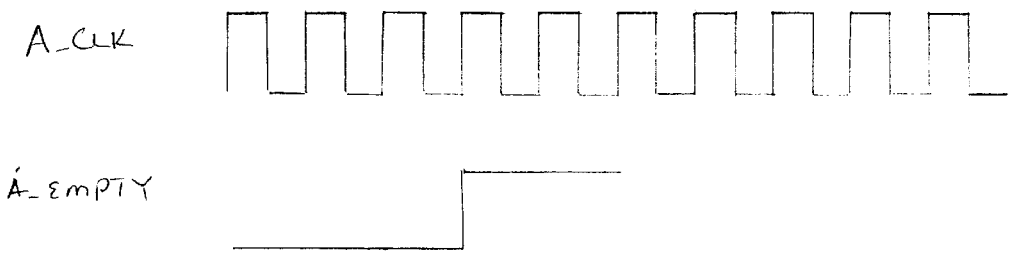
FIG. 2B is timing chart indicating the clock periods expended to obtain the status of a memory device using the circuit of FIG. 2B.

An analogous process occurs when the data written into memory 204 is to be retrieved in clock domain B. The READ_CONTROL signal present in clock domain B is synchronized with clock domain A to decrement up/down counter circuitry 208 for the purpose of keeping track of the number of data reads occurring from memory 204. In addition to incrementing up/down counter 208 in clock domain A, up/down counter 214 within clock domain B is decremented as well. In this manner, the number of reads occurring within each up/down counter is readily comparable to the number of writes in that counter to determine whether the memory is FULL or EMPTY. Advantageously, not only is the status of each memory separately determinable from within each clock domain, the present invention facilitates the process by completing the task within 4–6 clocks unlike conventional memory circuits that accomplish the task in no less than nine clocks. FIG. 2B is a timing chart indicating the clock periods expended to obtain the status of a memory device using circuit 200 of FIG. 2B.

While the above is a complete description of exemplary specific embodiments of the invention, additional embodiments are also possible. Thus, the above description should not be taken as limiting the scope of the invention, which is defined by the appended claims along with their full scope of equivalents.

What is claimed is:

1. A system for obtaining a status of a memory device during data transfer between a first clock domain controlled by a first frequency and a second clock domain controlled by a second frequency, different from the first frequency, the system comprising:

a write control signal operating at the first clock frequency for writing the data into the memory device;

a translated write control signal derived from the write control signal and operating at the second clock frequency;

a read control signal operating at the second clock frequency for reading the data from the memory device;

a translated read control signal derived from the read control signal and operating at the first clock frequency;

a first counter circuitry incremented by the write control signal and decremented by the translated read control signal; and a second counter circuitry incremented by the translated write control signal and decremented by the read control signal.

2. The system of claim 1 wherein the second counter circuit further comprises an output for determining, within the second clock domain, whether the memory is full.

3. The system of claim 1 wherein the first and second counter circuitry includes up/down counters.

4. The method of claim 1, wherein the translated write control signal is synchronized to the second clock domain.

5. The method of claim 1, wherein the translated read control signal is synchronized to the first clock domain.

6. The method of claim wherein the memory device includes a FIFO.

7. A method for obtaining a status of a memory device during data transfer between a first clock domain controlled by a first frequency and a second clock domain controlled by a second frequency different from the first frequency, the method comprising:

using a write control signal operating at the first clock frequency for writing the data into the memory device;

generating a translated write control signal derived from the write control signal and operating at the second clock frequency;

using a read control signal operating at the second clock frequency for reading the data from the memory device;

generating a translated read control signal derived from the read control signal and operating at the first clock frequency;

operating a first counter circuitry incremented by the write control signal and decremented by the translated read control signal; and operating a second counter circuitry incremented by the translated write control signal and decremented by the read control signal.

8. A computer-readable medium including instructions for obtaining a status of a memory device during data transfer between a first clock domain controlled by a first frequency and a second clock domain controlled by a second frequency different from the first frequency, the computer-readable medium comprising:

a process for using a write control signal operating at the first clock frequency for writing the data into the memory device;

a process for generating a translated write control signal derived from the write control signal and operating at the second clock frequency;

a process for using a read control signal operating at the second clock frequency for reading the data from the memory device;

a process for generating a translated read control signal derived from the read control signal and operating at the first clock frequency;

a process for operating a first counter circuitry incremented by the write control signal and decremented by the translated read control signal; and a process for operating a second counter circuitry incremented by the translated write control signal and decremented by the read control signal.

9. An apparatus for obtaining a status of a FIFO memory device during data transfer between a first clock domain controlled by a first frequency and a second clock domain controlled by a second frequency different from the first frequency, the apparatus comprising:

a write control signal operating at the first clock frequency for writing the data into the memory device;

a translated write control signal derived from the write control signal and operating at the second clock frequency;

a read control signal operating at the second clock frequency for reading the data from the memory device;

a translated read control signal derived from the read control signal and operating at the first clock frequency;

a first up/down counter incremented by the write control signal and decremented by the translated read control signal, wherein the first up/down counter outputs at least one signal to indicate a status of the FIFO memory device; and a second up/down counter incremented by the translated write control signal and decremented by the read control signal, wherein the second up/down counter outputs at least one signal to indicate a status of the FIFO memory device.

* * * * *